United States Patent
Zhang (10) Patent No.: US 10,765,023 B2
(45) Date of Patent: Sep. 1, 2020

(54) CONNECTING ASSEMBLY, FLEXIBLE DISPLAY SCREEN, AND FLEXIBLE ELECTRONIC DEVICE

(71) Applicant: Lenovo (Beijing) Co., Ltd., Beijing (CN)

(72) Inventor: Ran Zhang, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/142,986

(22) Filed: Sep. 26, 2018

(65) Prior Publication Data
US 2019/0098783 A1 Mar. 28, 2019

(30) Foreign Application Priority Data

Sep. 26, 2017 (CN) .......................... 2017 1 0882921

(51) Int. Cl.
*G06F 1/16* (2006.01)
*H05K 5/02* (2006.01)
*H05K 5/00* (2006.01)
*F16C 11/04* (2006.01)
*E05D 11/00* (2006.01)
*E05D 3/06* (2006.01)
(Continued)

(52) U.S. Cl.
CPC ............. *H05K 5/0226* (2013.01); *E05D 3/06* (2013.01); *E05D 11/0054* (2013.01);
(Continued)

(58) Field of Classification Search
CPC .... G06F 1/1652; G06F 1/1616; G06F 1/1601; G06F 1/1618; H05K 5/0017; E05D 3/06; F16C 11/04
See application file for complete search history.

(56) References Cited

U.S. PATENT DOCUMENTS 8,971,032 B2 * 3/2015 Griffin .................. G06F 1/1652
345/156
9,047,055 B2 * 6/2015 Song .......................... E05D 3/14
(Continued)

FOREIGN PATENT DOCUMENTS

CN 105549682 A 5/2016
CN 105659187 A 6/2016
(Continued)

OTHER PUBLICATIONS

CN206100081 U-Machine Translation-2019 (Year: 2019).*

*Primary Examiner* — Adrian S Wilson
(74) *Attorney, Agent, or Firm* — Anova Law Group, PLLC (57) ABSTRACT

A connecting assembly includes a plurality of link members, a hanging-hole-shaped fixing structure having openings configured to hole the plurality of link members, a first shaft and a second shaft coupled to the plurality of link members, and a first fixing member and a second fixing member for coupling to a first display region and a second display region of the flexible display screen respectively. The first and the second fixing members are further coupled to the first shaft and the second shaft respectively. The openings of the hanging-hole-shaped fixing structure are movable to arrange the plurality of link members at different distances from each other, in order to bend the flexible display screen upon a force being exerted on the flexible display screen to cause a relative motion between the first and second display regions of the flexible display screen.

15 Claims, 9 Drawing Sheets

(51) Int. Cl.
  *H04M 1/02* (2006.01)
  *G09F 9/30* (2006.01)
  *H05K 5/03* (2006.01)
(52) U.S. Cl.
  CPC ............ *F16C 11/04* (2013.01); *G06F 1/1652* (2013.01); *G06F 1/1681* (2013.01); *G09F 9/301* (2013.01); *H04M 1/022* (2013.01); *H05K 5/0017* (2013.01); *E05D 2011/0072* (2013.01); *E05Y 2900/606* (2013.01); *H05K 5/03* (2013.01)

(56) References Cited

U.S. PATENT DOCUMENTS

| | | | | |
|---|---|---|---|---|
| 9,870,031 B2* | 1/2018 | Hsu | ....................... | G06F 1/1681 |
| 9,915,981 B2* | 3/2018 | Hsu | ....................... | G06F 1/1681 |
| 9,930,794 B2* | 3/2018 | Luan | ..................... | H05K 5/0217 |
| 10,114,424 B2* | 10/2018 | Campbell | ........... | E05D 11/0081 |
| 10,174,534 B2* | 1/2019 | Tazbaz | ..................... | E05D 3/14 |
| 10,437,293 B2* | 10/2019 | Bitz | ....................... | G06F 1/1616 |
| 10,448,527 B2* | 10/2019 | Lin | .......................... | E05D 7/00 |
| 2013/0002583 A1* | 1/2013 | Jin | ........................ | G06F 1/1637 345/173 |
| 2014/0213324 A1 | 7/2014 | Tan et al. | | |
| 2016/0139634 A1* | 5/2016 | Cho | ....................... | G06F 1/1652 361/679.27 |
| 2017/0023987 A1* | 1/2017 | Wang | ..................... | G06F 1/1681 |

FOREIGN PATENT DOCUMENTS

| | | |
|---|---|---|
| CN | 205446377 U | 8/2016 |
| CN | 206100081 U | 4/2017 |
| WO | 2016109123 A1 | 7/2016 |

* cited by examiner

CONNECTING ASSEMBLY, FLEXIBLE DISPLAY SCREEN, AND FLEXIBLE ELECTRONIC DEVICE

CROSS-REFERENCES TO RELATED APPLICATIONS

This application claims priority of Chinese Patent Application No. 201710882921.9, filed on Sep. 26, 2017, the entire contents of which are hereby incorporated by reference.

FIELD OF THE INVENTION

The present disclosure generally relates to the field of electronic device manufacturing technology and, more particularly, relates to a connecting assembly, a flexible display screen, and a flexible electronic device thereof.

BACKGROUND

With the development of science and technology, many new products come into being to meet various sophisticated and diversified needs. In particular, the appearance of flexible display screen has advanced the development of new electronic products. A flexible display screen can be folded to allow one to experience two types of products: a tablet and a dual-screen cell phone, thereby increasing the value of the product and improving consumers' purchase intention.

In existing flexible display screens, the general appearance is that the middle part is curved with the two sides being flat. The shaft structures for these flexible display screens with curved middle-part and flat two-sides generally have problems. They either sacrifice the flatness of the flexible display screens to ensure the bendability of the middle parts, or sacrifice the service life to satisfy the flatness of the flexible display screens. In other words, the existing shaft structures for the flexible display screens have difficulties to balance the flatness and a long service life.

BRIEF SUMMARY OF THE DISCLOSURE

A first aspect of the present disclosure is a connecting assembly including a plurality of link members, a hanging-hole-shaped fixing structure having openings configured to hole the plurality of link members, a first shaft and a second shaft coupled to the plurality of link members, and a first fixing member and a second fixing member for coupling to a first display region and a second display region of the flexible display screen respectively. The first and the second fixing members are further coupled to the first shaft and the second shaft respectively. The openings of the hanging-hole-shaped fixing structure are movable to arrange the plurality of link members at different distances from each other, in order to bend the flexible display screen upon a force being exerted on the flexible display screen to cause a relative motion between the first and second display regions of the flexible display screen A second aspect of the present disclosure is a flexible display screen including a first display region, a second display region, and a connecting assembly. The connecting assembly includes a plurality of link members, a hanging-hole-shaped fixing structure having openings configured to hole the plurality of link members, a first shaft and a second shaft coupled to the plurality of link members, and a first fixing member and a second fixing member for coupling to a first display region and a second display region of the flexible display screen respectively. The first and the second fixing members are further coupled to the first shaft and the second shaft respectively. The openings of the hanging-hole-shaped fixing structure are movable to arrange the plurality of link members at different distances from each other, in order to bend the flexible display screen upon a force being exerted on the flexible display screen to cause a relative motion between the first and second display regions of the flexible display screen.

A third aspect of the present disclosure is a flexible electronic device including a flexible display screen. The flexible display screen includes a first display region, a second display region, and a connecting assembly. The connecting assembly includes a plurality of link members, a hanging-hole-shaped fixing structure having openings configured to hole the plurality of link members, a first shaft and a second shaft coupled to the plurality of link members, and a first fixing member and a second fixing member for coupling to a first display region and a second display region of the flexible display screen respectively. The first and the second fixing members are further coupled to the first shaft and the second shaft respectively. The openings of the hanging-hole-shaped fixing structure are movable to arrange the plurality of link members at different distances from each other, in order to bend the flexible display screen upon a force being exerted on the flexible display screen to cause a relative motion between the first and second display regions of the flexible display screen.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to example embodiments of the present disclosure, which are illustrated in the accompanying drawings. Wherever possible, the same reference numbers may be used throughout the drawings to refer to the same or like parts. The described embodiments are some, but not all, of the embodiments of the present disclosure. Based on the disclosed embodiments and without inventive efforts, persons of ordinary skill in the art may derive other embodiments consistent with the present disclosure, all of which are within the scope of the present disclosure.

Figure 1:
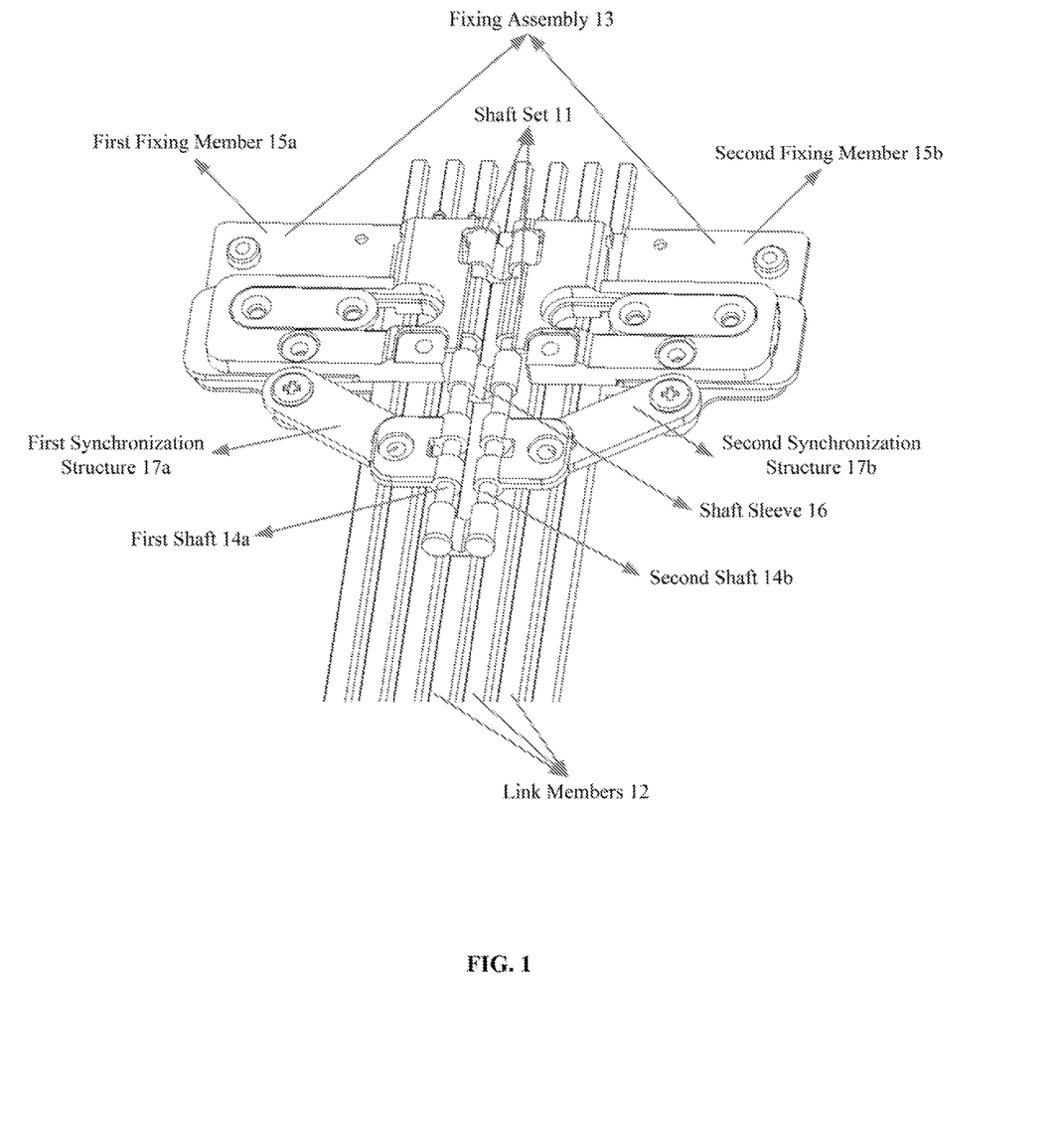
FIG. 1 illustrates a structure schematic diagram of a connecting assembly consistent with the disclosed embodiments.
Figure 2:
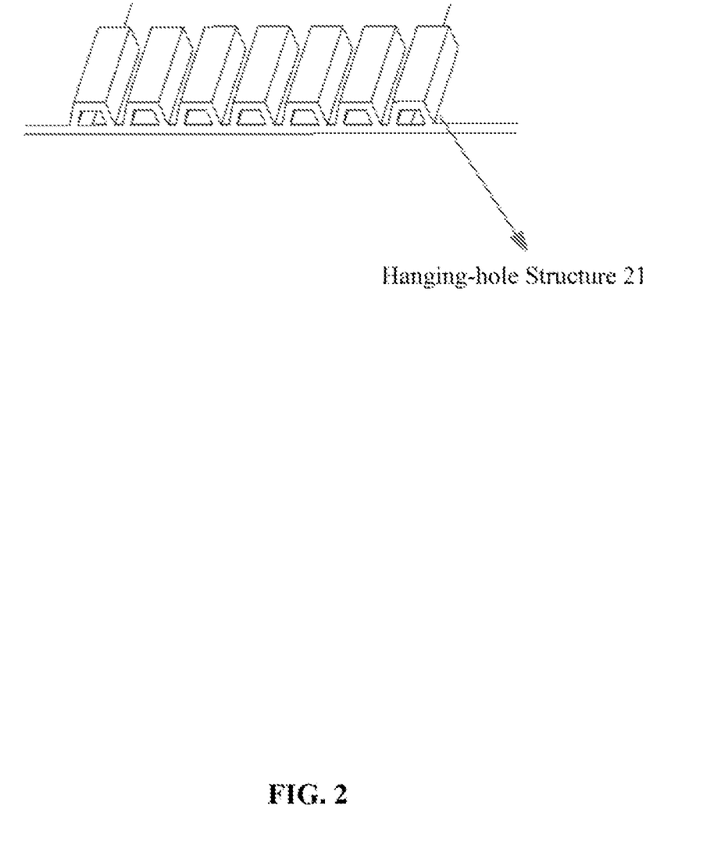
FIG. 2 illustrates a schematic diagram of a hanging-hole-shaped fixing structure in a connecting assembly consistent with the disclosed embodiments.

FIG. 1 illustrates a structure schematic diagram of the connecting assembly consistent with the present embodiment, and FIG. 2 illustrates a structure schematic diagram of a hanging-hole-shaped fixing structure in the connecting assembly consistent with the present embodiment. As shown in FIG. 1 and FIG. 2, the disclosed connecting assembly may include one or more shaft sets 11 (together or individually may be referred as a shaft set 11), a hanging-hole-shaped fixing structure, and one or more fixing assemblies 13 (together or individually may be referred as a fixing assembly 13).

The hanging-hole-shaped fixing structure may be fixedly connected with the one or more shaft sets 11 to set up a middle display region of a flexible display screen (not shown). To allow the middle display region to be bendable, the hanging-hole-shaped fixing structure may include a plurality of link members 12 that are connected with the hanging-hole-shaped fixing structure by passing through openings of the hanging-hole-shaped fixing structure.

The one or more fixing assemblies 13 may be flexibly connected with the first display region and the second display region of the flexible display screen. The first display region and the second display region are located on two sides of the middle display region. Additionally, the one or more fixing assemblies 13 may be also fixedly connected with the one or more shaft sets 11. Relying on the shaft sets 11 connected with the fixing assemblies 13, the first display region may be able to rotate relative to the second display region of the flexible display screen.

As shown in FIG. 1, in certain embodiments, a shaft set 11 may include a first shaft 14a and a second shaft 14b, while a fixing assembly 13 may include a first fixing member 15a and a second fixing member 15b. The first shaft 14a may be in parallel with the second shaft 14b. The first fixing member 15a may be sleeved on one end of the first shaft 14a, while the second fixing member 15b may be sleeved on one end of the second shaft 14b. The shaft set 11 may be further provided with one or more shaft sleeves 16 that are adapted to wrap the first shaft 14a and the second shaft 14b. When the first shaft 14a and/or the second shaft 14b rotate with respect to the shaft sleeve(s), torque can be generated. Additionally, the first fixing member 15a may be fixedly connected with the first display region, while the second fixing member 15b may be fixedly connected with the second display region.

In certain embodiments, the shaft sleeve(s) 16 may be fixedly connected with the hanging-hole-shaped fixing structure. Accordingly, the shaft set 11 and the fixing assembly 13 may be fixed to the hanging-hole-shaped fixing structure through the shaft sleeve(s) 16.

In certain embodiments, in order to facilitate synchronous rotation of rotating shafts in the shaft set, the shaft set 11 may be further provided with a first synchronization structure 17a for connecting the first shaft 14a with the first fixing member 15a, and a second synchronization structure 17b for connecting the second shaft 14b with the second fixing member 15b. The first synchronization structure 17a and the second synchronization structure 17b, when working together, may allow the first shaft 14a and the second shaft 14b to synchronously rotate. At the same time, by fixing the first synchronization structure 17a and the second synchronization structure 17b to the first fixing member 15a and the second fixing member 15b, respectively, the first display region and the second display region may also synchronously rotate.

In certain embodiments, the hanging-hole-shaped fixing structure may comprise at least two sets of hanging-hole structures 21. In real applications, a set of hanging-hole structure 21 may be made by molding. Specifically, as shown in FIG. 2, a set of hanging-hole structure 21 may include a plurality of openings. Two or more sets of hanging-hole structure 21 may be aligned so that the link members 12 can pass through the plurality of openings or holes of the corresponding two or more sets of hanging-hole structure 21 to form a plate-like structure comprising a plurality of link members 12. For example, a plurality of link members 12 may pass through the plurality of openings of the aligned two sets of hanging-hole structure 21 to form a structure as shown in FIG. 3, in which the two sets of hanging-hole structures 21 are fixed on the two ends of the link members 12.

Figure 3:
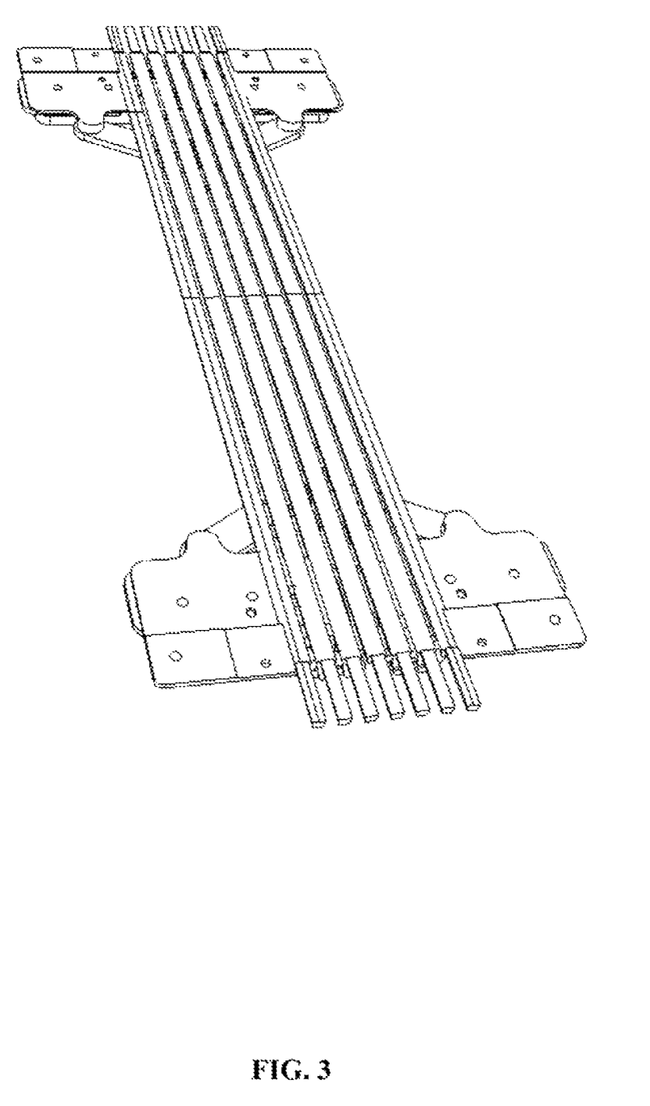
FIG. 3 illustrates another structure schematic diagram of a connecting assembly consistent with the disclosed embodiments.
Figure 4:
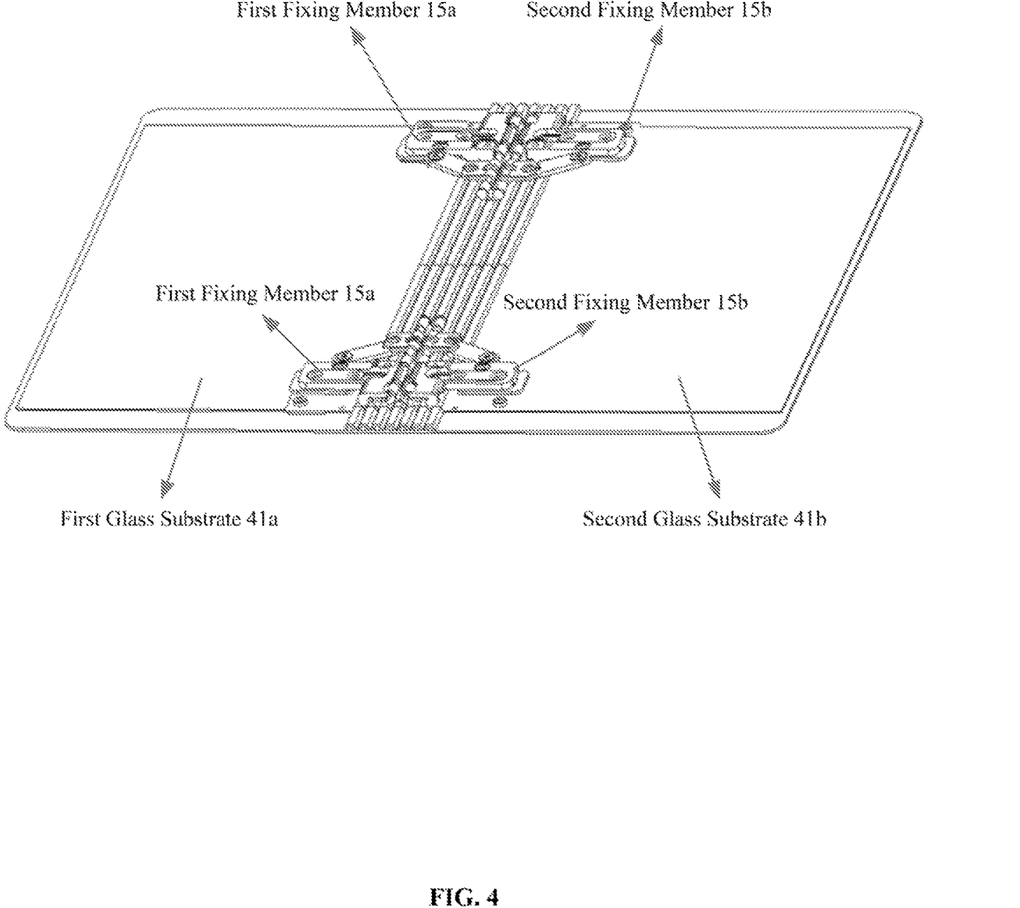
FIG. 4 illustrates another structure schematic diagram of a connecting assembly consistent with the disclosed embodiments.

To facilitate fixing the flexible display screen, the connecting assembly in FIG. 3 may comprise two shaft sets 11 and two fixing assemblies 13. Each shaft set 11 and each fixing assembly 13 may correspond to one set of hanging-hole structure 21. That is, each set of hanging-hole structure 21 may be fixedly connected with one shaft set 11 and one fixing assembly 13, which together form the connecting assembly as shown in FIG. 3. Further, after the first display region and the second display region of the flexible display screen are respectively fixed by the first fixing members 15a and the second fixing members 15b in the two fixing assemblies 13, a structure as shown in FIG. 4 may be formed. Organized this way, the formed connecting assembly may have a single neutral plane (i.e., a conceptual plane within a beam or cantilever in which the material of the beam is not under stress, either compression or tension).

In certain embodiments, an elastic material layer may be disposed on the hanging-hole-shaped fixing structure. Thus, the middle display region of the flexible display screen may lie on the elastic material layer. Arranged this way, when the connecting assembly bends, the elastic material layer may provide effective absorption and compensation to maintain the surface flatness of the flexible display screen. In certain embodiments, the above described elastic material may be an optical grade silica gel that will not affect the light transmissivity of the flexible display screen.

In real applications, before fixing the flexible display screen, the fixing assembly 13 may be used to first fix a glass substrate. This may improve the surface flatness of the flexible display screen. Specifically, as shown in FIG. 4, the first fixing member 15a and the second fixing member 15b may be first fixedly connected with a first glass substrate 41a and a second glass substrate 41b. The first display region and the second display region may then be fixed to the first glass substrate 41a and the second glass substrate 41b. Arranged this way, the surface flatness of the first display region and the second display region may be improved, resulting in an improved flatness of the whole flexible display screen.

Figure 5:
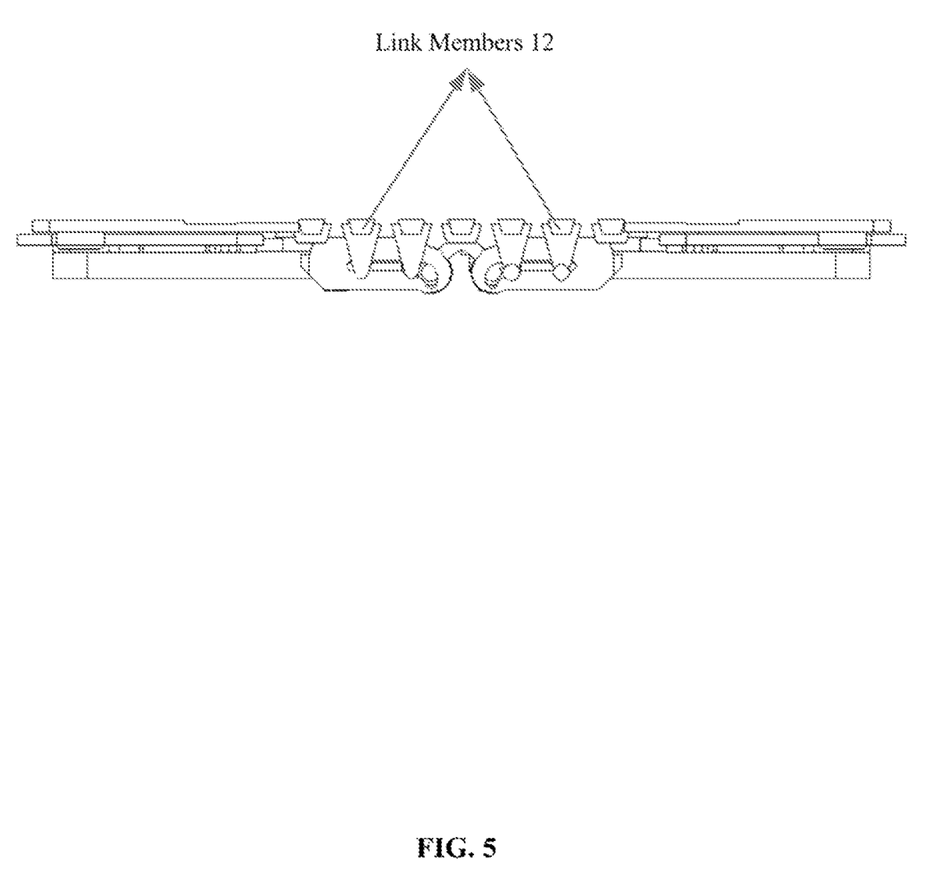
FIG. 5 illustrates a schematic diagram of a connecting assembly for a flexible display screen in a first state consistent with the disclosed embodiments.
Figure 6:
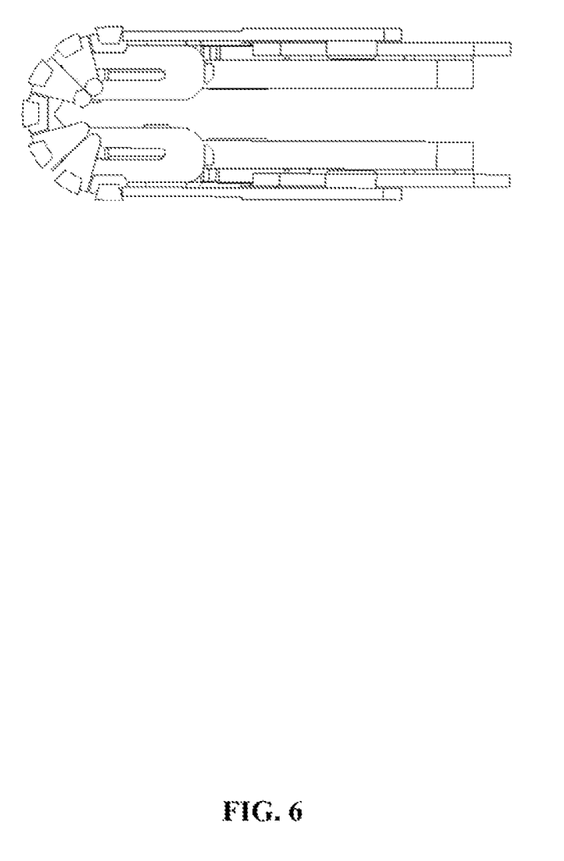
FIG. 6 illustrates a schematic diagram of a connecting assembly for a flexible display screen in a second state consistent with the disclosed embodiments.

FIG. 5 illustrates a schematic diagram of the connecting assembly for a flexible display screen in a first state. FIG. 6 illustrates a schematic diagram of the connecting assembly for a flexible display screen in a second state. As shown in FIG. 5, the first state may be a flat state, in which the two adjacent link members 12 are separated without constraint.

As the flexible display screen is being bent, the gap between two adjacent link members 12 become smaller and smaller, and eventually to a minimal or even none when the bending reaches to the maximum, as shown in FIG. 6.

Accordingly, the disclosed embodiments provide a connecting assembly that includes a hanging-hole-shaped fixing structure disposed in the middle display region of a flexible display screen to allow the middle part of the flexible display screen to be bendable. The included hanging-hole-shaped fixing structure includes a plurality of link members 12 that are connected via a hanging-hole approach, which may help address problems existed in other approaches. For instance, if the plurality of link members 12 are connected by a welding approach, fractures may appear in the soldering area during the bending process, which then shortens the service life of the flexible display screen. Therefore, the connecting assembly disclosed in the present embodiment may improve the service life of the flexible display screen without affecting its bendability.

In certain embodiments, a flexible display screen is provided. The flexible display screen may include a connecting assembly. Specifically, FIG. 1 illustrates a structure schematic diagram of the connecting assembly consistent with the embodiments, and FIG. 2 illustrates a structure schematic diagram of a hanging-hole-shaped fixing structure in the connecting assembly consistent with the embodiments. As shown in FIG. 1 and FIG. 2, the disclosed connecting assembly may include one or more shaft sets 11, a hanging-hole-shaped fixing structure, and one or more fixing assemblies 13.

The hanging-hole-shaped fixing structure may be fixedly connected with the one or more shaft sets 11 to set up a middle display region of a flexible display screen (not shown). To allow the middle display region to be bendable, the hanging-hole-shaped fixing structure may include a plurality of link members 12 that are connected with the hanging-hole-shaped fixing structure by passing through openings of the hanging-hole-shaped fixing structure.

The one or more fixing assemblies 13 may be fixedly connected with the first display region and the second display region of the flexible display screen. Additionally, the one or more fixing assemblies 13 may be also fixedly connected with the one or more shaft sets 11. Relying on the shaft sets 11 connected with the fixing assemblies 13, the first display region may be able to rotate relative to the second display region of the flexible display screen.

As shown in FIG. 1, in certain embodiments, a shaft set 11 may include a first shaft 14a and a second shaft 14b, while a fixing assembly 13 may include a first fixing member 15a and a second fixing member 15b. The first shaft 14a may be in parallel with the second shaft 14b. The first fixing member 15a may be sleeved on one end of the first shaft 14a, while the second fixing member 15b may be sleeved on one end of the second shaft 14b. The shaft set 11 may be further provided with one or more shaft sleeves 16 that are adapted to wrap the first shaft 14a and the second shaft 14b. When the first shaft 14a and/or the second shaft 14b rotate with respect to the shaft sleeve(s), torque can be generated. Additionally, the first fixing member 15a may be fixedly connected with the first display region, while the second fixing member 15b may be fixedly connected with the second display region.

In certain embodiments, the shaft sleeve(s) 16 may be fixedly connected with the hanging-hole-shaped fixing structure. Accordingly, the shaft set 11 and the fixing assembly 13 may be fixed to the hanging-hole-shaped fixing structure through the shaft sleeve(s) 16.

In certain embodiments, in order to facilitate synchronous rotation of rotating shafts in the shaft set, the shaft set 11 may be further provided with a first synchronization structure 17a for connecting the first shaft 14a with the first fixing member 15a, and a second synchronization structure 17b for connecting the second shaft 14b with the second fixing member 15b. The first synchronization structure 17a and the second synchronization structure 17b, when working together, may allow the first shaft 14a and the second shaft 14b to synchronously rotate. At the same time, by fixing the first synchronization structure 17a and the second synchronization structure 17b to the first fixing member 15a and the second fixing member 15b, respectively, the first display region and the second display region may also synchronously rotate.

In certain embodiments, the hanging-hole-shaped fixing structure may comprise at least two sets of hanging-hole structures 21. In real applications, a set of hanging-hole structure 21 may be made by molding. Specifically, as shown in FIG. 2, a set of hanging-hole structure 21 may include a plurality of openings. Two or more sets of hanging-hole structure 21 may be aligned so that the link members 12 can pass through the plurality of openings or holes of the corresponding two or more sets of hanging-hole structure 21 to form a plate-like structure comprising a plurality of link members 12. For example, a plurality of link members 12 may pass through the plurality of openings of the aligned two sets of hanging-hole structure 21 to form a structure as shown in FIG. 3, in which the two sets of hanging-hole structures 21 are fixed on the two ends of the link members 12.

To facilitate fixing the flexible display screen, the connecting assembly in FIG. 3 may comprise two shaft sets 11 and two fixing assemblies 13. Each shaft set 11 and each fixing assembly 13 may correspond to one set of hanging-hole structure 21. That is, each set of hanging-hole structure 21 may be fixedly connected with one shaft set 11 and one fixing assembly 13, which together form the connecting assembly as shown in FIG. 3. Further, after the first display region and the second display region of the flexible display screen are respectively fixed by the first fixing members 15a and the second fixing members 15b in the two fixing assemblies 13, a structure as shown in FIG. 4 may be formed. Organized this way, the formed connecting assembly may have a single neutral plane.

In certain embodiments, at least a part of the first display region and/or the second display region of the flexible display screen may be disposed with a substrate (e.g., a glass substrate). The disposed substrate may improve the hardness of the first display region and/or the second display region of the flexible display screen.

In certain embodiments, an elastic material layer may be disposed on the hanging-hole-shaped fixing structure. Thus, the middle display region of the flexible display screen may lie on the elastic material layer. Arranged this way, when the connecting assembly bends, the elastic material layer may provide effective absorption and compensation to maintain the surface flatness of the flexible display screen. In certain embodiments, the above described elastic material may be an optical grade silica gel that will not affect the light transmissivity of the flexible display screen.

In real applications, before fixing the flexible display screen, the fixing assembly 13 may be used to first fix a glass substrate. This may improve the surface flatness of the flexible display screen. Specifically, as shown in FIG. 4, the first fixing member 15a and the second fixing member 15b may be first fixedly connected with a first glass substrate 41a and a second glass substrate 41b. The first display region and the second display region may then be fixed to the first glass substrate 41a and the second glass substrate 41b. Arranged this way, the surface flatness of the first display region and the second display region may be improved, resulting in an improved flatness of the whole flexible display screen.

FIG. 5 illustrates a schematic diagram of the connecting assembly for a flexible display screen in a first state. FIG. 6 illustrates a schematic diagram of the connecting assembly for a flexible display screen in a second state. As shown in FIG. 5, the first state may be a flat state, in which the two adjacent link members 12 are separated without constraint. As the flexible display screen is being bent, the gap between two adjacent link members 12 become smaller and smaller, and eventually to a minimal or even none when the bending reaches to the maximum, as shown in FIG. 6.

Accordingly, the disclosed embodiments provide a flexible display screen that includes a hanging-hole-shaped fixing structure disposed in the middle display region of a flexible display screen to allow the middle part of the flexible display screen to be bendable. The included hanging-hole-shaped fixing structure includes a plurality of link members 12 that are connected via a hanging-hole approach, which may help address problems existed in other approaches. For instance, if the plurality of link members 12 are connected by a welding approach, fractures may appear in the soldering area during the bending process, which then shortens the service life of the flexible display screen. Therefore, the connecting assembly consistent with the embodiments may improve the service life of the flexible display screen without affecting its bendability.

In certain embodiments, a flexible electronic device is provided. The flexible electronic device may include a flexible display screen that is set up by a connecting assembly. Specifically, FIG. 1 illustrates a structure schematic diagram of the connecting assembly consistent with the embodiments, and FIG. 2 illustrates a structure schematic diagram of a hanging-hole-shaped fixing structure in the connecting assembly consistent with the embodiments. As shown in FIG. 1 and FIG. 2, the disclosed connecting assembly may include one or more shaft sets 11, a hanging-hole-shaped fixing structure, and one or more fixing assemblies 13.

The hanging-hole-shaped fixing structure may be fixedly connected with the one or more shaft sets 11 to set up a middle display region of a flexible display screen (not shown). To allow the middle display region to be bendable, the hanging-hole-shaped fixing structure may include a plurality of link members 12 that are connected with the hanging-hole-shaped fixing structure by passing through openings of the hanging-hole-shaped fixing structure.

The one or more fixing assemblies 13 may be fixedly connected with the first display region and the second display region of the flexible display screen. Additionally, the one or more fixing assemblies 13 may be also fixedly connected with the one or more shaft sets 11. Relying on the shaft sets 11 connected with the fixing assemblies 13, the first display region may be able to rotate relative to the second display region of the flexible display screen.

As shown in FIG. 1, in certain embodiments, a shaft set 11 may include a first shaft 14a and a second shaft 14b, while a fixing assembly 13 may include a first fixing member 15a and a second fixing member 15b. The first shaft 14a may be in parallel with the second shaft 14b. The first fixing member 15a may be sleeved on one end of the first shaft 14a, while the second fixing member 15b may be sleeved on one end of the second shaft 14b. The shaft set 11 may be further provided with one or more shaft sleeves 16 that are adapted to wrap the first shaft 14a and the second shaft 14b. When the first shaft 14a and/or the second shaft 14b rotate with respect to the shaft sleeve(s), torque can be generated. Additionally, the first fixing member 15a may be fixedly connected with the first display region, while the second fixing member 15b may be fixedly connected with the second display region.

In certain embodiments, the shaft sleeve(s) 16 may be fixedly connected with the hanging-hole-shaped fixing structure. Accordingly, the shaft set 11 and the fixing assembly 13 may be fixed to the hanging-hole-shaped fixing structure through the shaft sleeve(s) 16.

In certain embodiments, in order to facilitate synchronous rotation of rotating shafts in the shaft set, the shaft set 11 may be further provided with a first synchronization structure 17a for connecting the first shaft 14a with the first fixing member 15a, and a second synchronization structure 17b for connecting the second shaft 14b with the second fixing member 15b. The first synchronization structure 17a and the second synchronization structure 17b, when working together, may allow the first shaft 14a and the second shaft 14b to synchronously rotate. At the same time, by fixing the first synchronization structure 17a and the second synchronization structure 17b to the first fixing member 15a and the second fixing member 15b, respectively, the first display region and the second display region may also synchronously rotate.

In certain embodiments, the hanging-hole-shaped fixing structure may comprise at least two sets of hanging-hole structures 21. In real applications, a set of hanging-hole structure 21 may be made by molding. Specifically, as shown in FIG. 2, a set of hanging-hole structure 21 may include a plurality of openings. Two or more sets of hanging-hole structure 21 may be aligned so that the link members 12 can pass through the plurality of openings or holes of the corresponding two or more sets of hanging-hole structure 21 to form a plate-like structure comprising a plurality of link members 12. For example, a plurality of link members 12 may pass through the plurality of openings of the aligned two sets of hanging-hole structure 21 to form a structure as shown in FIG. 3, in which the two sets of hanging-hole structures 21 are fixed on the two ends of the link members 12.

To facilitate fixing the flexible display screen, the connecting assembly in FIG. 3 may comprise two shaft sets 11 and two fixing assemblies 13. Each shaft set 11 and each fixing assembly 13 may correspond to one set of hanging-hole structure 21. That is, each set of hanging-hole structure 21 may be fixedly connected with one shaft set 11 and one fixing assembly 13, which together form the connecting assembly as shown in FIG. 3. Further, after the first display region and the second display region of the flexible display screen are respectively fixed by the first fixing members 15a and the second fixing members 15b in the two fixing assemblies 13, a structure as shown in FIG. 4 may be formed. Organized this way, the formed connecting assembly may have a single neutral plane.

In certain embodiments, at least a part of the first display region and/or the second display region of the flexible display screen may be disposed with a substrate (e.g., a glass substrate). The disposed substrate may improve the hardness of the first display region and/or the second display region of the flexible display screen.

In certain embodiments, an elastic material layer may be disposed on the hanging-hole-shaped fixing structure. Thus, the middle display region of the flexible display screen may lie on the elastic material layer. Arranged this way, when the connecting assembly bends, the elastic material layer may provide effective absorption and compensation to maintain the surface flatness of the flexible display screen. In certain embodiments, the above described elastic material may be an optical grade silica gel that will not affect the light transmissivity of the flexible display screen.

In real applications, before fixing the flexible display screen, the fixing assembly 13 may be used to first fix a glass substrate. This may improve the surface flatness of the flexible display screen. Specifically, as shown in FIG. 4, the first fixing member 15a and the second fixing member 15b may be first fixedly connected with a first glass substrate 41a and a second glass substrate 41b. The first display region and the second display region may then be fixed to the first glass substrate 41a and the second glass substrate 41b. Arranged this way, the surface flatness of the first display region and the second display region may be improved, resulting in an improved flatness of the whole flexible display screen.

FIG. 5 illustrates a schematic diagram of the connecting assembly for a flexible display screen in a first state. FIG. 6 illustrates a schematic diagram of the connecting assembly for a flexible display screen in a second state. As shown in FIG. 5, the first state may be a flat state, in which the two adjacent link members 12 are separated without constraint. As the flexible display screen is being bent, the gap between two adjacent link members 12 become smaller and smaller, and eventually to a minimal or even none when the bending reaches to the maximum, as shown in FIG. 6.

Figure 7:
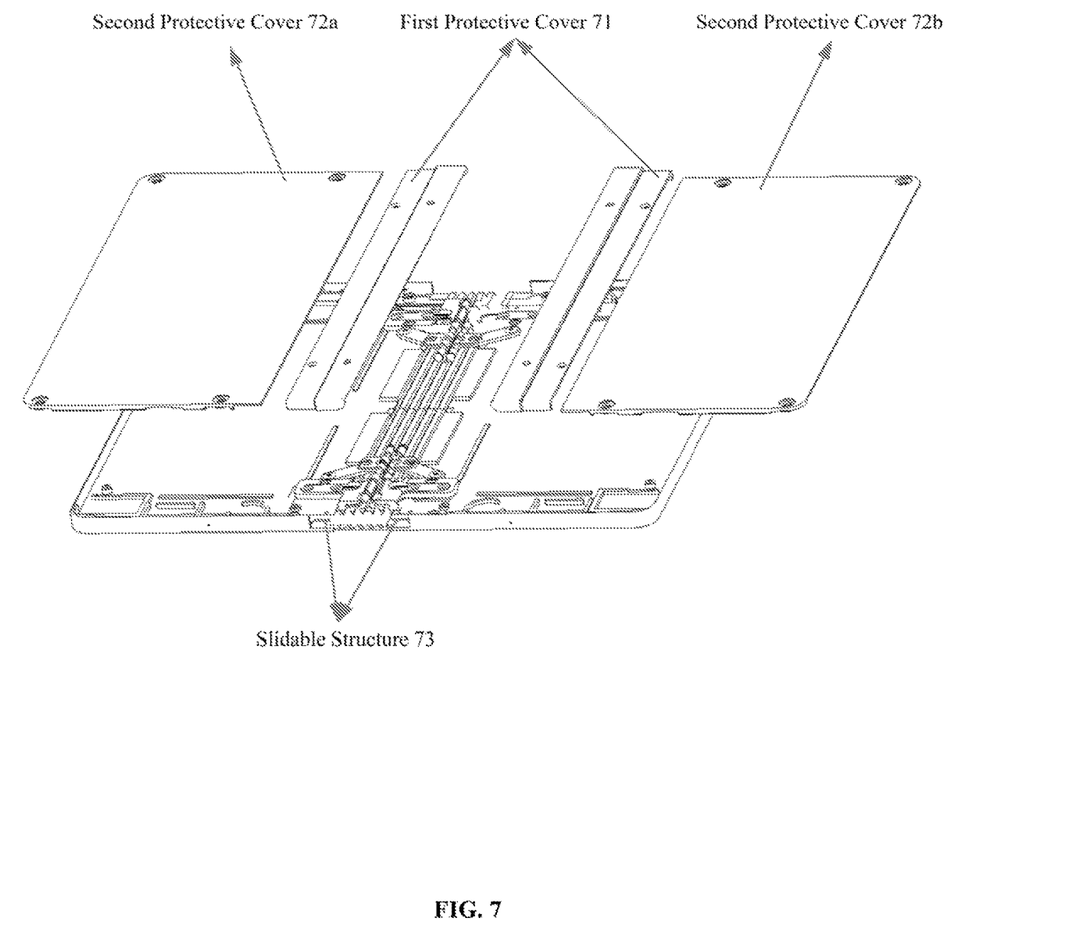
FIG. 7 illustrates a structure schematic diagram of a flexible electronic device consistent with the disclosed embodiments.
Figure 8:
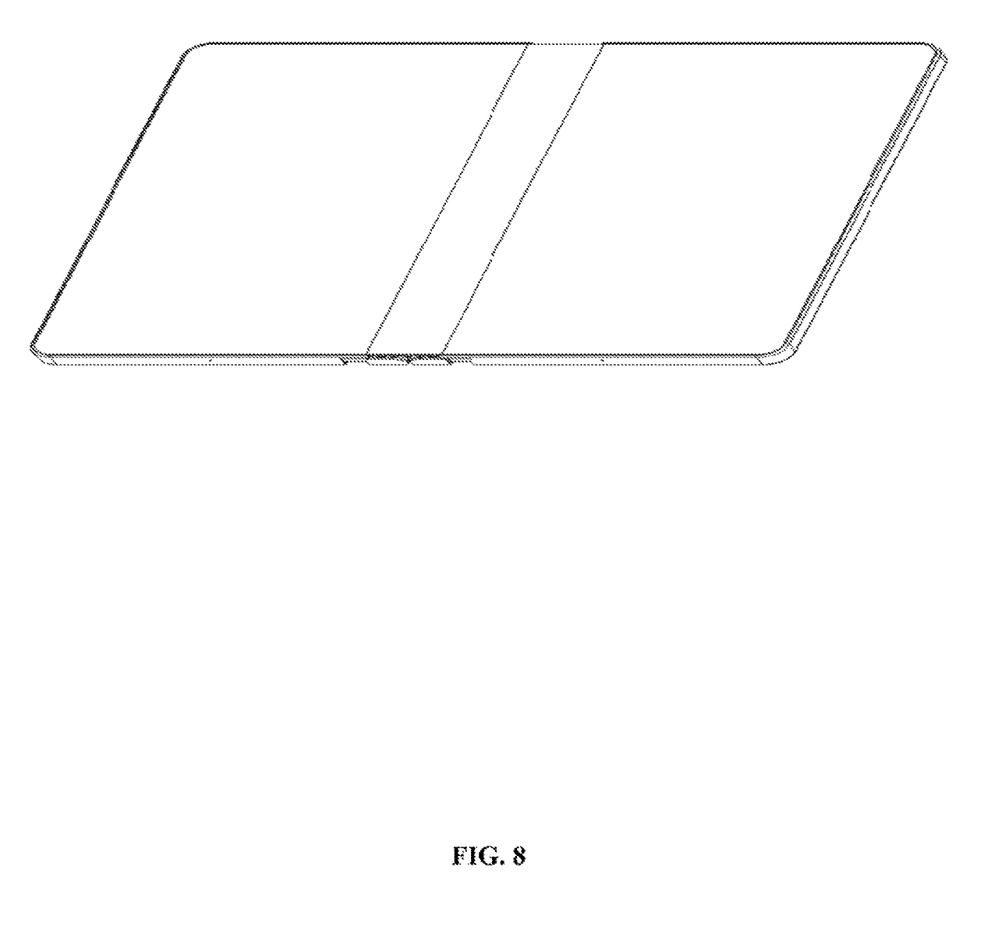
FIG. 8 illustrates another structure schematic diagram of a flexible electronic device consistent with the disclosed embodiments.

In certain embodiments, the flexible electronic device may include a first protective cover and one or more second protective covers. Specifically, as illustrated in FIG. 7, the first protective cover 71 may cover the connecting assembly of the flexible display screen, while the one or more second protective covers 72 may cover components-occupying areas corresponding to the first display region and the second display region of the flexible display screen to protect these components-occupying areas. After covering the connecting assembly and the components-occupying areas with the first protective cover 71 and the one or more second protective covers 72, a flexible electronic device as shown in FIG. 8 may be obtained.

Figure 9:
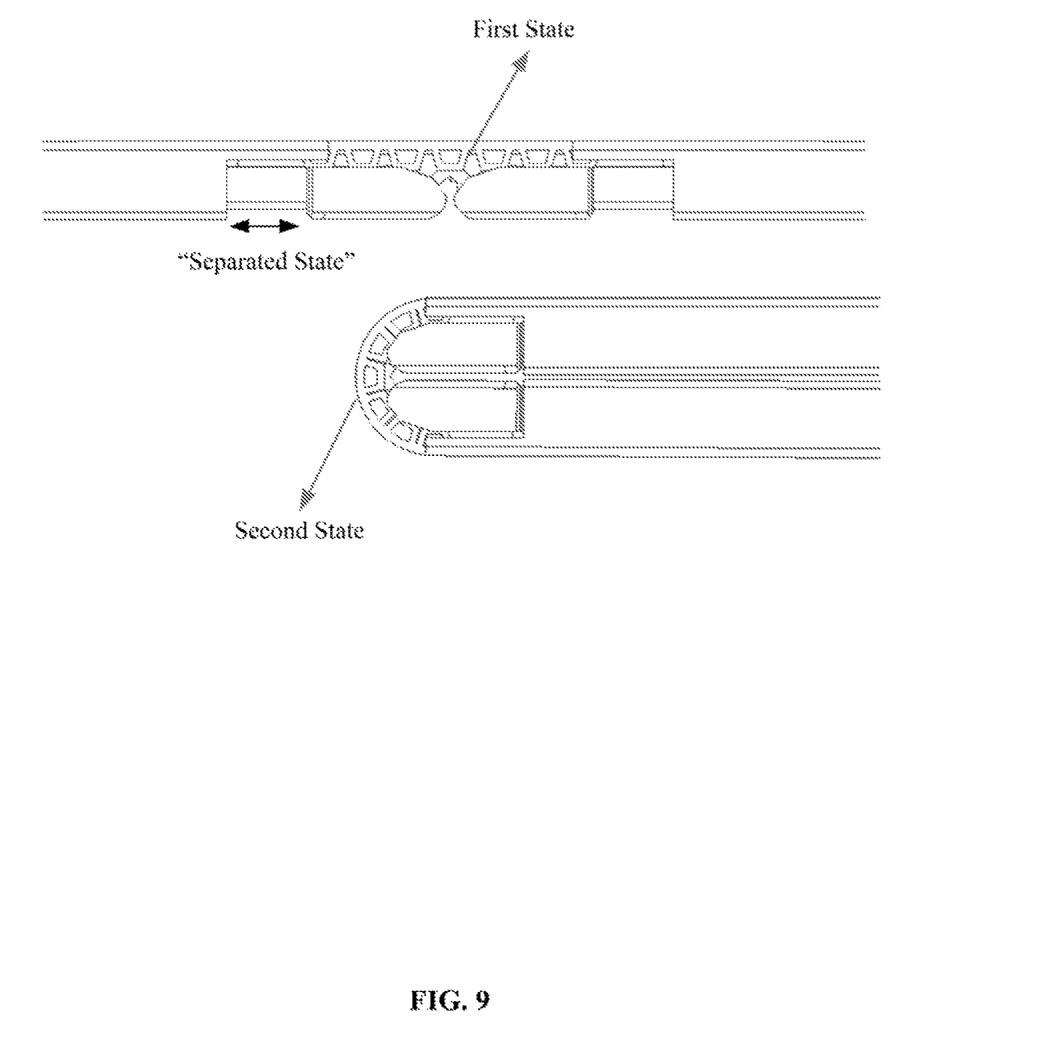
FIG. 9 illustrates structure schematic diagrams of a flexible electronic device in a first state and a second state consistent with the disclosed embodiments.

In certain embodiments, the first protective cover 71 may be connected with the one or more second protective covers 72 via a slidable structure 73, to allow an adjustment of the extension of the one or more second protective covers 72 when the hanging-hole-shaped fixing structure of the flexible electronic device is being bent. Specifically, as shown in FIG. 9, when the flexible electronic device is in the first state (i.e., the flat state), the slidable structure 73 may remain a "separated state" (i.e., the gaps between the first protective cover and the one or more second protective covers are relatively large). When the flexible electronic device is being bent, the gaps become smaller and smaller, until they reach the minimal or even none when the bending reaches the maximum (i.e., can't be further bent).

Accordingly, the disclosed embodiments provide a flexible electronic device that includes a hanging-hole-shaped fixing structure disposed in the middle display region of a flexible display screen to allow the middle part of the flexible display screen to be bendable. The included hanging-hole-shaped fixing structure includes a plurality of link members 12 that are connected via a hanging-hole approach, which may help address problems existed in other approaches. For instance, if the plurality of link members 12 are connected by a welding approach, fractures may appear in the soldering area during the bending process, which then shortens the service life of the flexible display screen. Therefore, the connecting assembly consistent with the embodiments may improve the service life of the flexible display screen without affecting its bendability.

Although the foregoing is a detailed description of the present disclosure with reference to specific embodiments, it should be understood that the present disclosure is not limited to the embodiments disclosed. For those skilled in the art to which the present disclosure belongs, various modifications and alterations can be made without departing from the spirit of the present disclosure as hereinafter claimed, and shall all fall within the scope of the present disclosure.

What is claimed is:

1. A connecting assembly for a flexible display screen, the connecting assembly comprising:
    a plurality of link members;
    a hanging-hole-shaped fixing structure having openings configured to hold the plurality of link members, the hanging-hole-shaped fixing structure including an elastic material layer configured to provide absorption and compensation to maintain surface flatness of the flexible display screen, and a material of the elastic material layer including an optical grade silica gel that does not affect light transmissivity of the flexible display screen;
    a first shaft and a second shaft coupled to the plurality of link members; and
    a first fixing member and a second fixing member for coupling to a first display region and a second display region of the flexible display screen respectively, the first and the second fixing members being further coupled to the first shaft and the second shaft respectively,
    wherein the openings of the hanging-hole-shaped fixing structure are movable to arrange the plurality of link members at different distances from each other, in order to bend the flexible display screen upon a force being exerted on the flexible display screen to cause a relative motion between the first and second display regions of the flexible display screen.

2. The connecting assembly according to claim 1, wherein the hanging-hole-shaped fixing structure includes two or more sets of hanging-hole structure, each of the two or more sets of hanging-hole structure including a plurality of openings, and wherein the two or more sets of hanging-hole structure are aligned to allow the plurality of link members to pass through the plurality of the openings of each of the two or more sets of hanging-hole structure to form a plate-like structure.

3. The connecting assembly according to claim 1, wherein a middle display region of the flexible display screen lies over the elastic material layer, the first display region and the second display region being located on two sides of the middle display region.

4. The connecting assembly according to claim 1, further comprising:
    one or more shaft sleeves configured to wrap the first shaft and the second shaft to allow generation of a torque when the first shaft and the second shaft rotate within the one or more shaft sleeves;
    the first shaft is in parallel with the second shaft; and
    the first fixing member is sleeved on one end of the first shaft, and the second fixing member is sleeved on one end of the second shaft.

5. The connecting assembly according to claim 4, wherein one of the one or more shaft sleeves is fixedly connected with the hanging-hole-shaped fixing structure.

6. The connecting assembly according to claim 4, further comprising:
   a first synchronization structure connecting the first shaft with the first fixing member; and
   a second synchronization structure connecting the second shaft with the second fixing member,
   wherein the first synchronization structure and the second synchronization structure work together to allow the first shaft and the second shaft in the shaft set to synchronously rotate.

7. A flexible display screen, comprising:
   a first display region and a second display region; and
   a connecting assembly including:
      a plurality of link members;
      a hanging-hole-shaped fixing structure having openings configured to hold the plurality of link members, the hanging-hole-shaped fixing structure including an elastic material layer configured to provide absorption and compensation to maintain surface flatness of the flexible display screen, and a material of the elastic material layer including an optical grade silica gel that does not affect light transmissivity of the flexible display screen;
      a first shaft and a second shaft coupled to the plurality of link members; and
      a first fixing member and a second fixing member for coupling to the first display region and the second display region respectively, the first and the second fixing members being further coupled to the first shaft and the second shaft respectively,
      wherein the openings of the hanging-hole-shaped fixing structure are movable to arrange the plurality of link members at different distances from each other, in order to bend the flexible display screen upon a force being exerted on the flexible display screen to cause a relative motion between the first and second display regions of the flexible display screen.

8. The flexible display screen according to claim 7, wherein the hanging-hole-shaped fixing structure includes two or more sets of hanging-hole structure, each of the two or more sets of hanging-hole structure including a plurality of openings, and wherein the two or more sets of hanging-hole structure are aligned to allow the plurality of link members to pass through the plurality of the openings of each of the two or more sets of hanging-hole structure to form a plate-like structure.

9. The flexible display screen according to claim 7, wherein a middle display region of the flexible display screen lies over the elastic material layer, the first display region and the second display region being located on two sides of the middle display region.

10. The flexible display screen according to claim 7, further comprising a substrate placed under a part of one of the first display region and the second display region to improve hardness of the one of the first display region and the second display region with the substrate.

11. A flexible electronic device, comprising:
   a flexible display screen including:
      a first display region and a second display region; and
      a connecting assembly including:
         a plurality of link members;
         a hanging-hole-shaped fixing structure having openings configured to hold the plurality of link members, the hanging-hole-shaped fixing structure including an elastic material layer configured to provide absorption and compensation to maintain surface flatness of the flexible display screen, and a material of the elastic material layer including an optical grade silica gel that does not affect light transmissivity of the flexible display screen;
         a first shaft and a second shaft coupled to the plurality of link members; and
         a first fixing member and a second fixing member for coupling to the first display region and the second display region of the flexible display screen respectively, the first and the second fixing members being further coupled to the first shaft and the second shaft respectively,
         wherein the openings of the hanging-hole-shaped fixing structure are movable to arrange the plurality of link members at different distances from each other, in order to bend the flexible display screen upon a force being exerted on the flexible display screen to cause a relative motion between the first and second display regions of the flexible display screen.

12. The flexible electronic device according to claim 11, wherein the hanging-hole-shaped fixing structure includes two or more sets of hanging-hole structure, each of the two or more sets of hanging-hole structure including a plurality of openings, and wherein the two or more sets of hanging-hole structure are aligned to allow the plurality of link members to pass through the plurality of the openings of each of the two or more sets of hanging-hole structure to form a plate-like structure.

13. The flexible electronic device according to claim 11, wherein a middle display region of the flexible display screen lies over the elastic material layer, the first display region and the second display region being located on two sides of the middle display region.

14. The flexible electronic device according to claim 11, further comprising:
   a substrate placed under a part of one of the first display region and the second display region to improve hardness of the one of the first display region and the second display region with the substrate.

15. The flexible electronic device according to claim 14, further comprising:
   a first protective cover and one or more second protective covers,
   wherein:
      the first protective cover is configured to cover the connecting assembly of the flexible display screen;
      the one or more second protective covers are configured to cover one or more components-occupying areas corresponding to the first display region and the second display region of the flexible display screen to protect the one or more component-occupying areas; and
      the first protective cover is connected with the one or more second protective covers through a slidable structure to allow an adjustment of extension of the one or more second protective covers when the hanging-hole-shaped fixing structure of the flexible electronic device is being bent.

* * * * *